(12) United States Patent
Kok et al.

(10) Patent No.: US 7,198,678 B2
(45) Date of Patent: Apr. 3, 2007

(54) APPARATUS FOR PERFORMING AT LEAST ONE PROCESS ON A SUBSTRATE

(75) Inventors: Ronaldus Joannes Cornelis Maria Kok, Eindhoven (NL); Michael Adrianus Theodorus Hompus, Helmond (NL); Marinus Franciscus Johannes Evers, Heeze (NL); Anton Habraken, St. Oedenrode (NL); Franciscus Cornelius Dings, Veldhoven (NL)

(73) Assignee: OTB Group B.V., Eindhoven (NL)

( * ) Notice: Subject to any disclaimer, the term of this patent is extended or adjusted under 35 U.S.C. 154(b) by 93 days.

(21) Appl. No.: 10/332,381

(22) PCT Filed: Jun. 26, 2001

(86) PCT No.: PCT/NL01/00475

§ 371 (c)(1),
(2), (4) Date: Sep. 25, 2003

(87) PCT Pub. No.: WO02/04697

PCT Pub. Date: Jan. 17, 2002

(65) Prior Publication Data

US 2004/0083968 A1    May 6, 2004

(30) Foreign Application Priority Data

Jul. 12, 2000   (NL) .................... 1015690

(51) Int. Cl.
*C23C 16/00* (2006.01)
*C23F 1/00* (2006.01)

(52) U.S. Cl. ................... 118/719; 118/733; 156/345.31

(58) Field of Classification Search .................... None
See application file for complete search history.

(56) References Cited

U.S. PATENT DOCUMENTS

| 5,871,588 | A | * | 2/1999 | Moslehi et al. ............. 118/730 |
| 5,876,082 | A |  | 3/1999 | Kempf et al. |
| 6,203,677 | B1 | * | 3/2001 | Konig .................... 204/298.27 |
| 6,317,406 | B1 | * | 11/2001 | Konig et al. ................. 720/710 |

FOREIGN PATENT DOCUMENTS

| EP | 0 448 782 A2 | 10/1991 |
| EP | 0 905 275 A2 | 3/1999 |
| EP | 0 905 275 A3 | 2/2002 |
| JP | 7-292740 | 11/1995 |
| JP | 07292470 A * | 11/1995 |

* cited by examiner

*Primary Examiner*—Karla Moore
(74) *Attorney, Agent, or Firm*—Pillsbury Winthrop Shaw Pittman LLP

(57) ABSTRACT

Apparatus for performing at least one processing operation on a substrate, the apparatus being provided with at least one process chamber and a vacuum lock for the purposes of placing the substrate from the surroundings into a process chamber without the reduced pressure in the respective process chamber being lost, the vacuum lock comprising a vacuum chamber which is bounded by a number of walls and to which a vacuum pump is connected, while in one of the walls at least one supply opening is provided, and for the purpose of the or each process chamber in one of the walls a process chamber opening belonging to a respective process chamber is provided, the at least one supply opening being externally closable with an outer cover and being closable from the vacuum chamber with an inner cover. Further disclosed is an assembly of such an apparatus with a transport device for supplying substrates to a supply opening of the vacuum lock and removing same.

22 Claims, 12 Drawing Sheets

APPARATUS FOR PERFORMING AT LEAST ONE PROCESS ON A SUBSTRATE

This application is the National Phase of International Application PCT/NL01/00475 filed Jun. 26, 2001 which designated the U.S. and that International Application was published under PCT Article 21(2) in English.

The invention relates to an apparatus for performing at least one processing operation on a substrate, the apparatus being provided with at least one process chamber in which, in use, a processing operation takes place under reduced pressure, and being provided with a vacuum lock for the purpose of placing the substrate from the surroundings into a said process chamber without the reduced pressure in the respective process chamber being lost, the vacuum lock comprising a vacuum chamber which is bounded by a number of walls and to which a vacuum pump is connected, while in one of the walls at least one supply opening is provided, and for the purpose of the or each process chamber in one of the walls a process chamber opening belonging to a respective process chamber is provided, the at least one supply opening being externally closable with an outer cover and being closable from the vacuum chamber with an inner cover, the inner cover further serving as substrate support and being displaceable within the vacuum chamber to a said process chamber opening, wherein the or each inner cover is placed in a table which is situated in the vacuum chamber, which table is displaceable with the aid of a drive.

Such an apparatus is known from EP-A-0 448 782. The manner in which the table is driven by the drive in the known apparatus is not disclosed. From EP-A-0 905 275 a similar apparatus is known in which the drive is mounted externally of the vacuum chamber and wherein the shaft of the drive is extending through a bottom wall of the vacuum chamber.

It is known to subject substrates to a processing operation, such as, for instance, applying a layer with the aid of a sputter process, an evaporation process or like physical vapor deposition (PVD), chemical vapor deposition (CVD) or plasma enhanced chemical vapor deposition (PECVD) processes, as well as annealing a substrate for the purpose of obtaining particular properties.

In general, a so-called batchwise processing of substrates is known, whereby a large number of substrates simultaneously undergo the same process in a process chamber. Such batchwise processing offers the advantage of a large processing capacity. However, a problem is to ensure the same treatment conditions for all substrates present in the process chamber.

To solve this problem, processes are known whereby in each case a single substrate is introduced into a process chamber and undergoes a treatment there, the so-called single substrate processing. The conditions in the process chamber can then be exactly tuned to the single substrate present in the process chamber, which enables a better control of the process. The said EP-A-0 448 782 relates to single substrate processing.

The present invention also relates to an apparatus and an assembly for the purpose of single substrate processing.

It will be clear that in single substrate processing the time required for the transport of the substrates from and to the various process chambers is of great importance for the processing capacity of the apparatus. In general, the processing operations which the substrates undergo require a considerable underpressure. It is therefore desirable that upon opening of the process chamber for placing a substrate therein, the prevailing underpressure in the process chamber is not lost. The fact is that re-creating the considerable underpressure in the process chamber requires so much time that, already for that reason alone, the single substrate process is difficult to implement in an economically profitable manner. Moreover, contamination of the process chamber is to be avoided, so that opening the process chamber can only be done in a so-called clean room. Also the transport of the substrates from one processing operation to the next should preferably take place in a clean room. The costs of clean rooms are particularly high, so that the known single substrate processing is a particularly costly manner of processing substrates, which is used when very high requirements are imposed on the substrates to be manufactured.

These problems have been solved by EP-A-0 448 782.

In the known apparatus, when a process chamber is opened, a reduced pressure continues to prevail in it because the process chamber opening terminates in the vacuum chamber of the vacuum lock in which a vacuum is being maintained.

According to the invention, the drive is included in the vacuum chamber of the vacuum lock, wherein the drive comprises a series of magnets are mounted on the table, while on the walls of the vacuum lock at least one electromagnetic coil is mounted, the coil being connected to a controllable power source for forming an alternating magnetic field for the purpose of the displacement of the table.

As the drive of the table is included in the vacuum chamber, there is no necessity for lead-through provisions for the purpose of a rotation shaft or an axially moveable rod in the walls of the vacuum chamber. This affords considerable advantages. The fact is that such vacuum-tight lead-through provisions are generally costly, often lead to leakage, are subject to wear and cause a considerable friction, which necessitates relatively heavy motors and moreover considerably limits the speed with which the table movement can be carried out. This last, in turn, would have an adverse influence on the processing capacity of the apparatus.

With a thus constructed drive disposed internally in the vacuum chamber, very high displacement speeds can be obtained. High displacement speeds lead to a greater processing capacity, which in turn results in a lower cost price of the substrates.

A problem involved in the vacuum-tight closure of the covers is the deformation of the vacuum lock, more particularly of the walls thereof. As a result of the prevailing pressure differences, large wall surfaces are subject to considerable forces, and already a slight bending of the wall which includes the supply opening and the process chamber openings may lead to a leaking inner or outer cover. To solve these problems, the apparatus is characterized, according to a further elaboration of the invention, in that the vacuum lock has a substantially cylindrical circumferential wall and two substantially flat end walls, while in one of the end walls the at least one supply opening and the at least one process chamber opening are provided, and the two end walls are connected with each other by a central support near or in the middle of the cylindrical circumferential wall.

The cylindrical end wall itself already has an intrinsic strength and, moreover, the deformation thereof is less critical. Due to the central support, the end walls have a considerable stiffness, so that the deformation thereof is minimal, while yet a large number of supply openings and process chamber openings can be provided in the end wall for mounting different process chambers or for creating different access passages for the supply and removal of substrates. The particularly high stiffness which such a donut-shaped vacuum lock possesses is of great advantage in connection with the closure problems.

In such a design of the vacuum lock, it is particularly favorable when the table comprises a substantially circular disc which is rotatably bearing mounted on the central support and on or adjacent the cylindrical circumferential wall. When, according to a further elaboration of the invention, in the cylindrical circumferential wall, additionally an electromagnetic coil is mounted at uniformly distributed circumferential positions, with the above-mentioned series of magnets arranged adjacent a circular circumferential wall of the table, the table can be rotated through 180 degrees very fast. In the exemplary embodiment to be described hereinafter, in which the substrates have the size of a CD or DVD, such a rotation through 180 degrees can take place within 0.3 seconds. It will be clear that such a manner of transportation leads to a very high capacity of the apparatus.

To enable the table to be made of displaceable design, it is of importance that the inner cover can be moved away from the wall of the supply opening or the process chamber opening. To that end, according to a further elaboration of the invention, the at least one inner cover is connected with the table so as to be displaceable in a direction perpendicular to the table. Such a connection between the table and an inner cover can comprise, for instance, a spring. According to a further elaboration of the invention, the spring connection between the or each inner cover and the table can be formed by a disc-shaped plate having a central opening in which the inner cover is fitted, while the disc-shaped plate is mounted by an outer circumferential edge thereof to the table, while in the disc-shaped plate concentric, circular segment-shaped recesses are provided, which enable a displacement of the central opening relative to the outer circumferential edge in a direction perpendicular to the plane of the plate, while the edge of the central opening and the outer circumferential edge remain accurately parallel.

According to a further elaboration of the invention, a process chamber can have a process chamber pump connected to it. With such a separate process chamber pump, a different pressure can be created in the process chamber than the pressure prevailing in the vacuum chamber. Moreover, the process chamber pump can be used for the exhaustion of process gases released during the processing of the substrate.

The apparatus according to the invention is useful for various processes; thus, according to a further elaboration of the invention, a process chamber can be provided with at least one plasma source for the purpose of plasma enhanced chemical vapor deposition, or with at least one physical vapor deposition source, or with means for carrying out chemical vapor deposition, or with means for annealing the substrate.

Optionally, several process chambers can be connected to the vacuum lock, so that a substrate can undergo various processing operations without having to leave the vacuum chamber for that purpose. In particular during the transport between the different processing operations to be carried out in the process chambers, it is of great importance that the spaces in which the substrate is present be clean. Since in the apparatus according to the invention the substrates are either in the vacuum chamber of the vacuum lock or in a process chamber, the requirements that are imposed on the cleanliness of the space in which the apparatus according to the invention is disposed are much lower than in the single substrate processing known to date, which could take place exclusively in clean rooms.

As the or each supply opening is provided with an inner cover and an outer cover, it is only necessary, when placing a substrate in the vacuum chamber, to adjust the space between the inner cover and the outer cover to the required reduced pressure again. The procedure of placing a substrate is as follows:

The inner cover of a respective supply opening is closed, the outer cover is opened, the substrate to be processed is placed on the inner cover serving as substrate support, the outer cover is closed, and the inner cover is opened, thereby taking the substrate along. Only the volume between the inner cover and the outer cover needs to be evacuated again. The inner cover serving as substrate support, with the substrate present thereon, can subsequently be rapidly transported to the process chamber opening.

To minimize the time required to obtain the desired vacuum in the vacuum chamber after a new substrate has been inserted, it is particularly favorable, according to a further elaboration of the invention, when the space which is bounded by an opening edge of the at least one supply opening and the inner cover and the outer cover, when these are in a closed condition, has dimensions that are closely in line with the dimensions of the substrate to be treated by the apparatus, such that the volume of the space which is to be readjusted to the desired reduced pressure after closure of the outer cover is minimal.

The better this space is in line with the dimensions of the substrate to be treated, the less time it takes to adjust the vacuum chamber to the desired reduced pressure again. Such a short time in turn results in a larger processing capacity, which is favorable from the viewpoint of costs.

To prevent contamination of the vacuum chamber as a result of processing operations taking place in the at least one process chamber, it is favorable, according to a further elaboration of the invention, when a process chamber opening is substantially closable from the vacuum chamber with an inner cover.

The invention further relates to an assembly of an apparatus according to any one of the preceding claims with a transport device for supplying substrates to a supply opening of the vacuum lock and removing same. According to the invention, the transport device of the assembly is provided with at least one carrying head, displaceable with the aid of a transport mechanism, for engaging the substrate. With such an assembly, the apparatus can, without being manned, be loaded with substrates and the processed substrates can be removed from the apparatus without the apparatus being manned.

If the substrate to be processed comprises a central opening, such as, for instance, for the purpose of manufacturing a CD or DVD, it is particularly favorable, according to a further elaboration of the invention, when the transport device comprises loose clamping pieces which are clampable in the central opening of a substrate to be processed, and the clamping piece is engageable by the at least one carrying head. The substrate can then, together with the clamping piece, be introduced into the vacuum chamber and there remain connected with the substrate during the processing operations the substrate is to undergo. It is then preferred when the clamping piece is manufactured from magnetically susceptible material, and in the at least one carrying head an electromagnetic coil is arranged, the coil being connected to a controllable power source which for the purpose of retaining the clamping piece, and hence the substrate, generates an electromagnetic field in the coil which exerts an attractive action on the clamping piece. Thus, in a very simple manner, the substrate can be picked up and be delivered by the carrying head.

According to a further elaboration of the invention, the clamping piece can comprise a disc-shaped part which serves as inner mask for screening the central part of the substrate during the processing operation in the process chamber.

Optionally, when using a magnetically susceptible loose clamping piece, a permanent magnet may be arranged in the or each inner cover of the vacuum lock, which permanent magnet exerts an attractive action on the clamping piece. Thus a sure and centered placement of the substrate on the inner cover can be effected.

To limit the number of operations in the closure of a supply opening and hence to minimize the required time for placing a substrate in the vacuum chamber, it is particularly favorable, according to a further elaboration of the invention, when the at least one carrying head of the transport device also carries the outer cover.

The invention will be further elucidated on the basis of an exemplary embodiment, with reference to the drawing.

Figure 1:
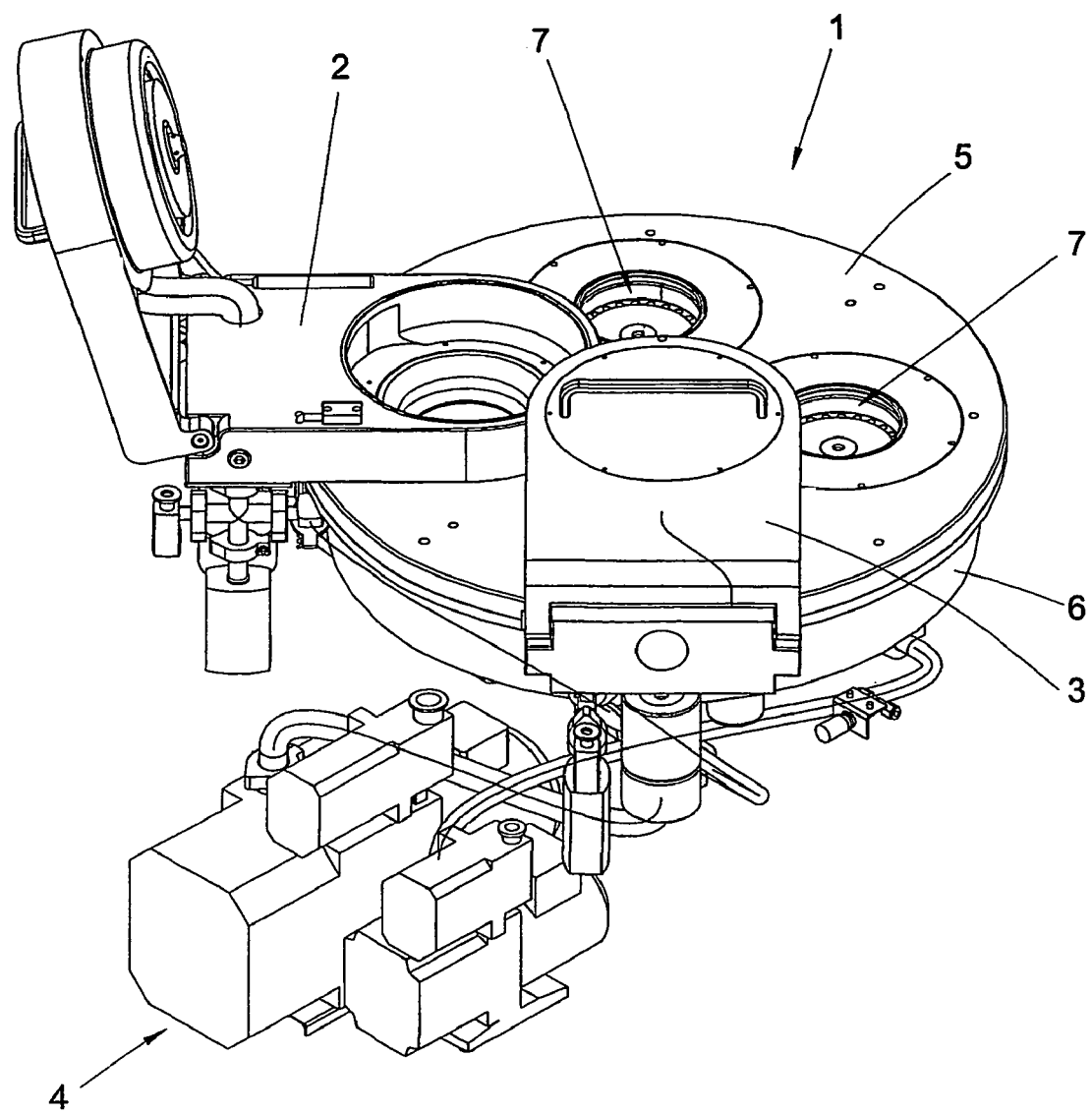
FIG. 1 shows a perspective view of a vacuum lock with two process chambers which in the present exemplary embodiment are designed as sputter process chambers.
Figure 2:
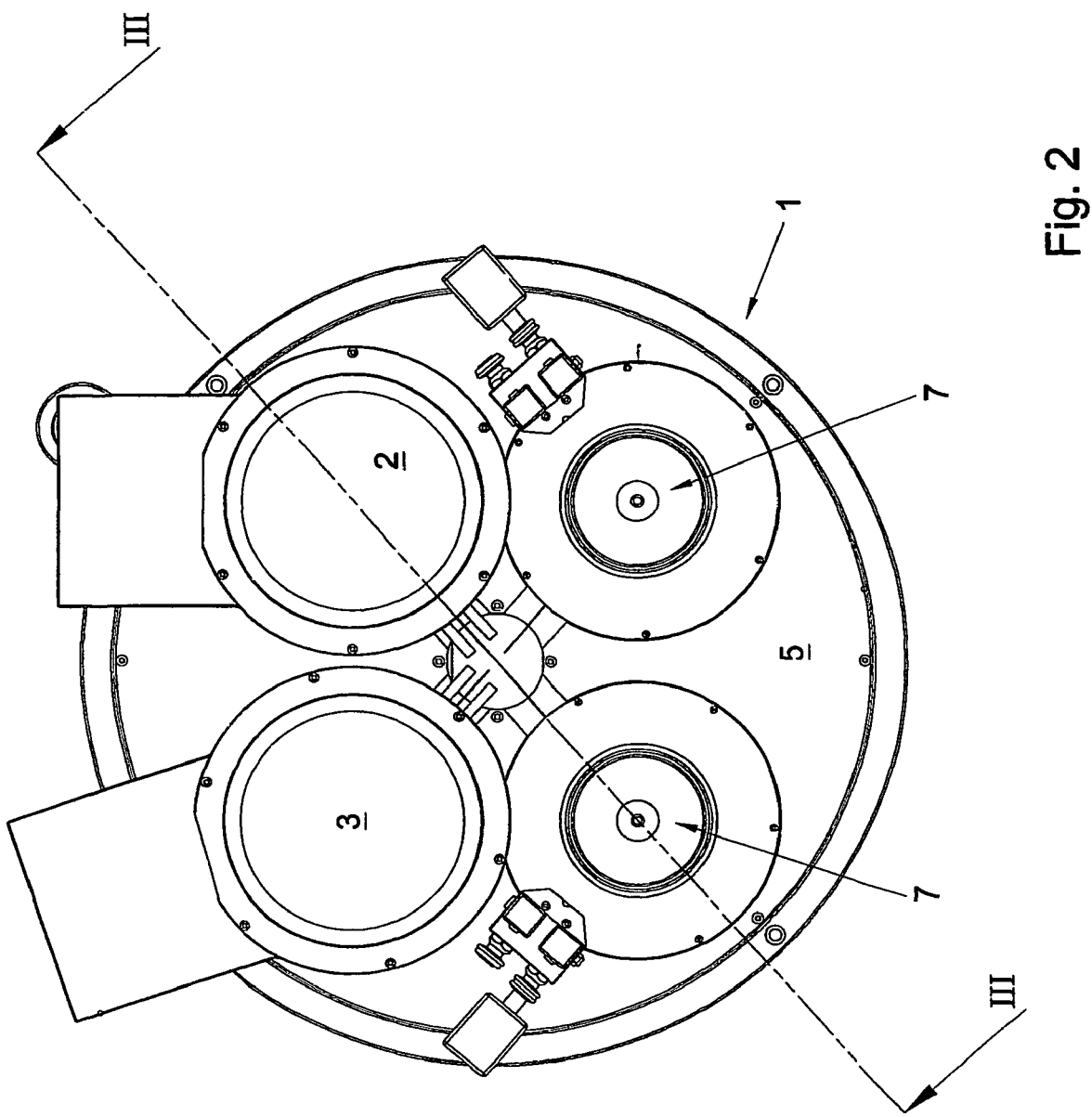
FIG. 2 shows a top plan view of the exemplary embodiment represented in FIG. 1.
Figure 3:
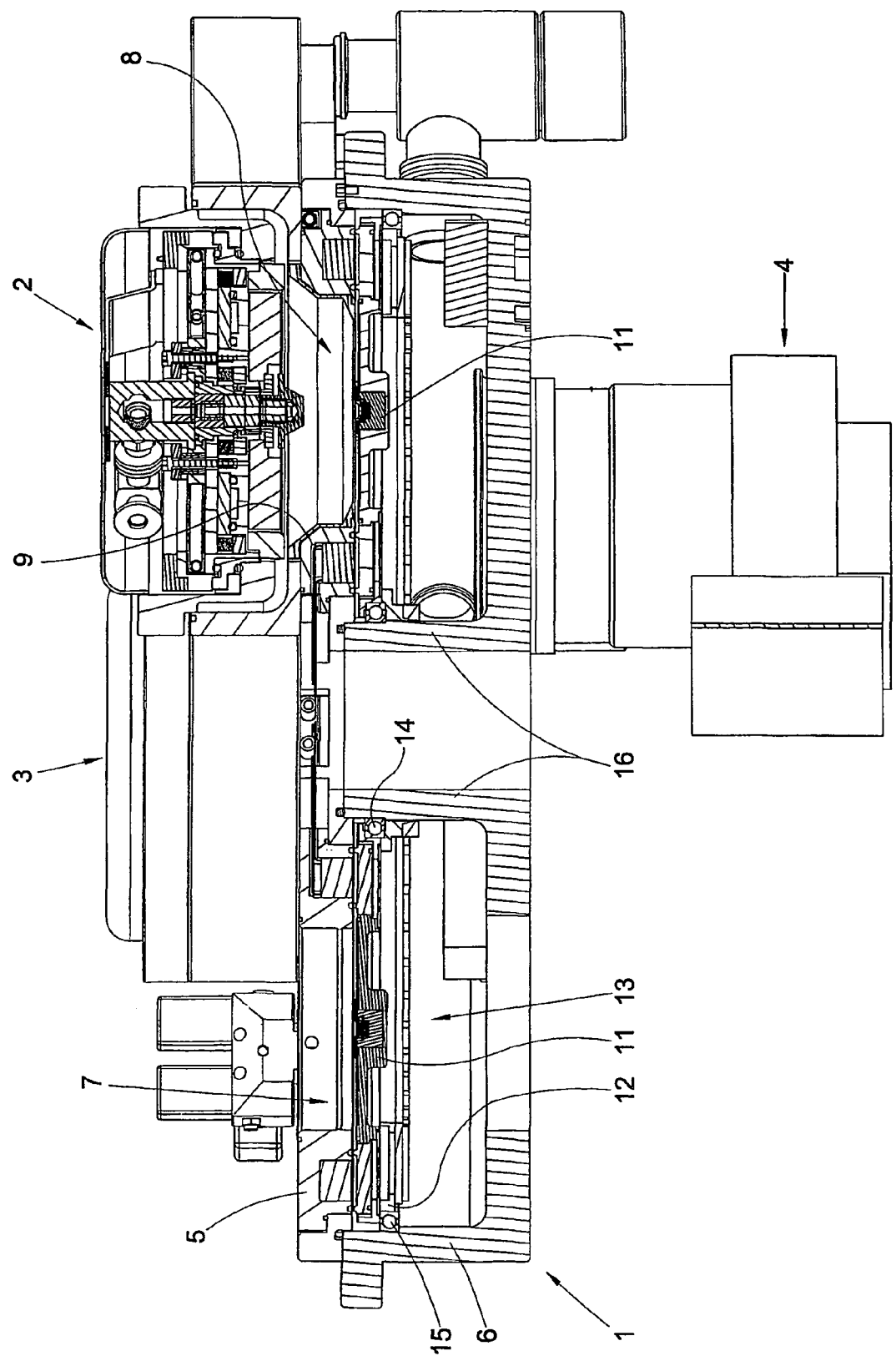
FIG. 3 shows a section along line III—III from FIG. 1.
Figure 4:
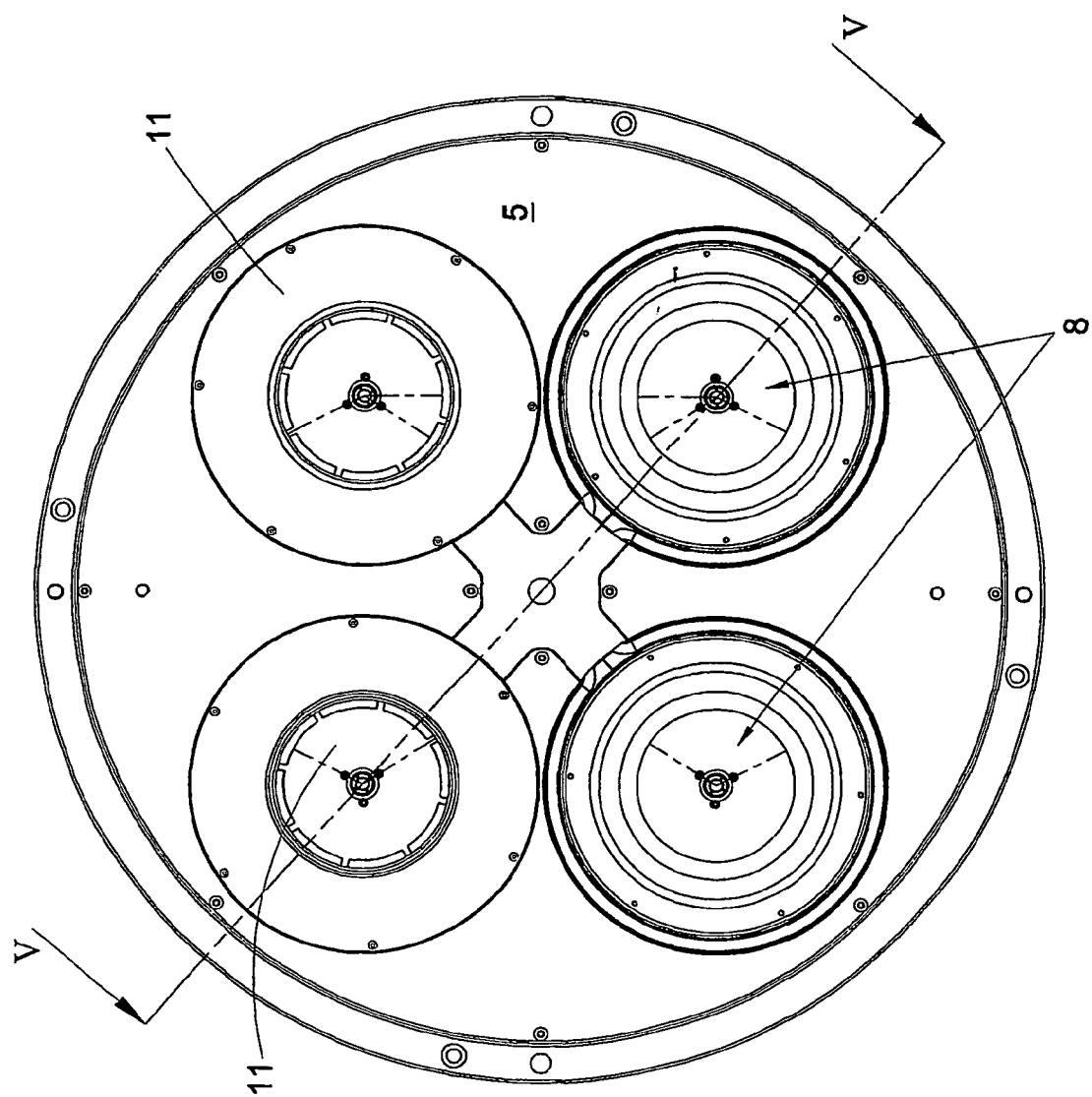
FIG. 4 shows a top plan view of the vacuum lock represented in FIGS. 1–3, with the sputter process chambers left out.

FIGS. 1–3 show an exemplary embodiment of a vacuum lock 1 having two process chambers 2, 3 mounted thereon, with the cover of the process chamber 2 represented in an open position, and the cover of the process chamber 3 represented in a closed position. The process chambers shown are intended for performing a sputter process therein. Such a process is known per se and does not need to be further elucidated here. Further, FIG. 1 shows a pump section 4 by means of which a vacuum can be created in the vacuum lock and the process chambers 2, 3. 'Vacuum' should here be understood to mean a pressure which is suitable for performing a sputter process. The figure further shows clearly that the vacuum lock 1 is provided with a top wall 5 and a cylindrical circumferential wall 6. Provided in the top wall 5 are two supply openings 7 for placing a substrate on a substrate support via those supply openings. Further, the top wall 5 is provided with two process chamber openings 8 which are better visible in FIGS. 4 and 5.

Figure 9:
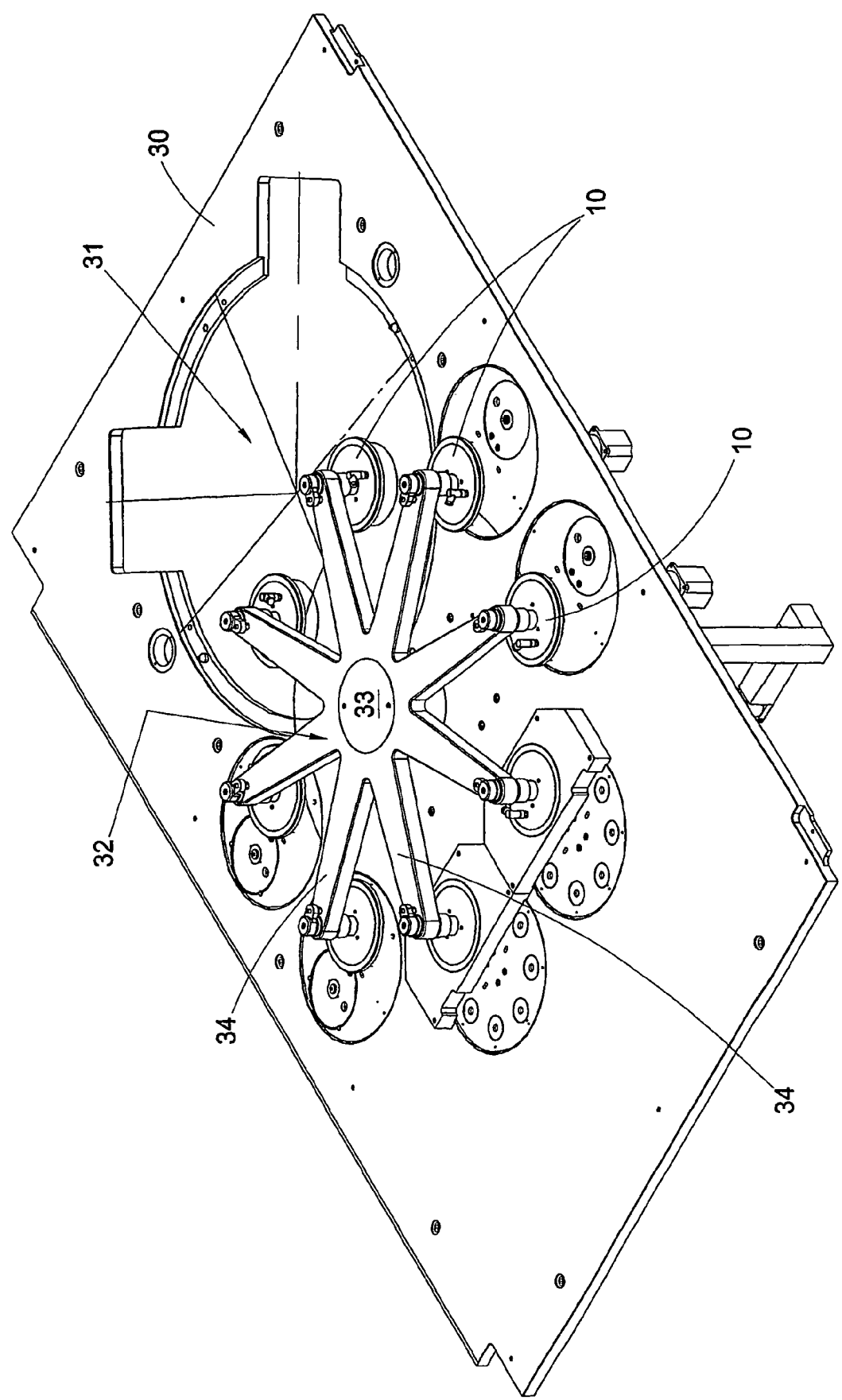
FIG. 9 shows a perspective view of a transport device destined for cooperation with a vacuum lock as represented in FIGS. 1–3.
Figure 11:
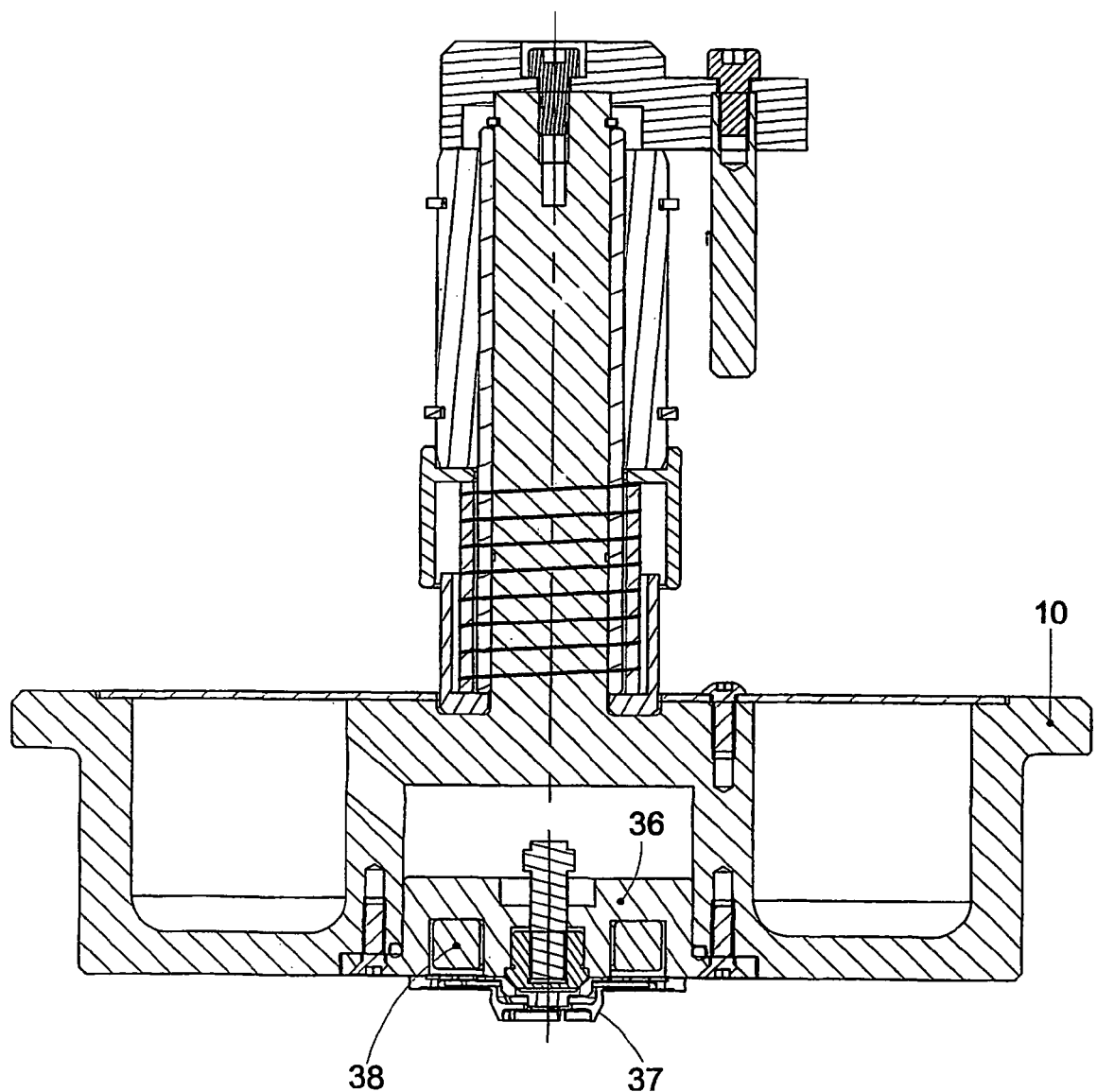
FIG. 11 shows a cross-sectional view of an outer cover with a clamping piece attached thereto.
Figure 12:
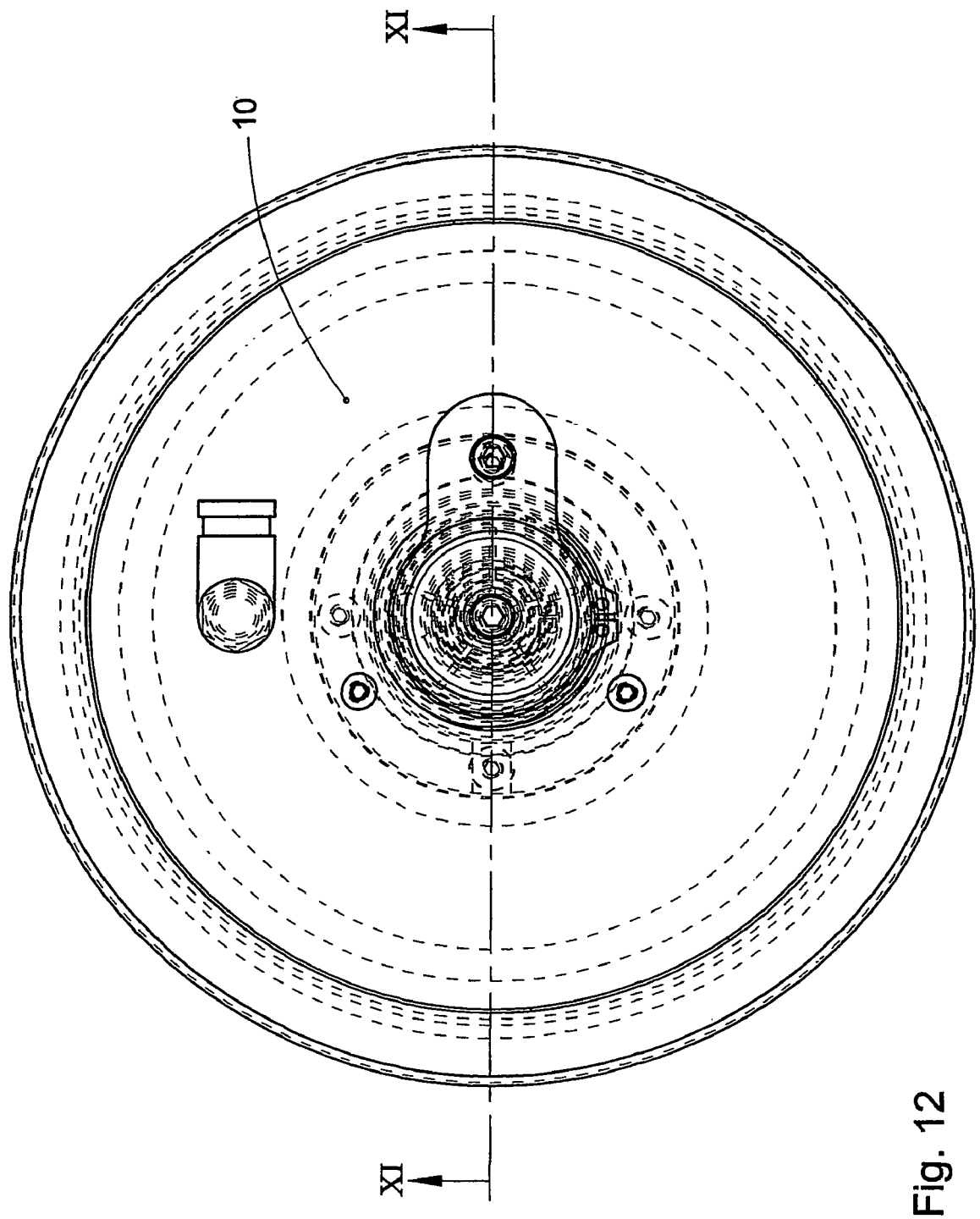
FIG. 12 shows a top plan view of the cover represented in FIG. 11.

FIG. 3 shows the interior of the vacuum lock 1. Clearly visible is the top wall 5, the cylindrical circumferential wall 6 and the supply opening 7 provided in the top wall, for supplying a substrate to the vacuum lock 1 and removing same. Further, in the top wall a process chamber opening 8 is visible, in which a so-called outer mask 9 is placed. The supply opening 7 is closable with an outer cover 10 which is represented in FIGS. 9, 11, 12. Further, the supply opening 7 is closable with an inner cover 11. The inner covers 11 are received in a substantially disc-shaped table 12, which is represented in more detail in FIGS. 6 and 7. The vacuum lock 1, and more particularly the walls thereof, bound a vacuum chamber 13 in which a desired reduced pressure prevails. The disc-shaped table 12 is rotatably bearing-mounted in the vacuum chamber 13 by means of bearings 14, 15. The inner bearing 14 rests on a central support 16 which connects the top wall 15 of the vacuum lock with the bottom wall 17 of the vacuum lock 1. Owing to this central support 16, the top wall 5 has a considerable stiffness which prevents deformation of the top wall 5 under the influence of the varying pressures.

Figure 5:
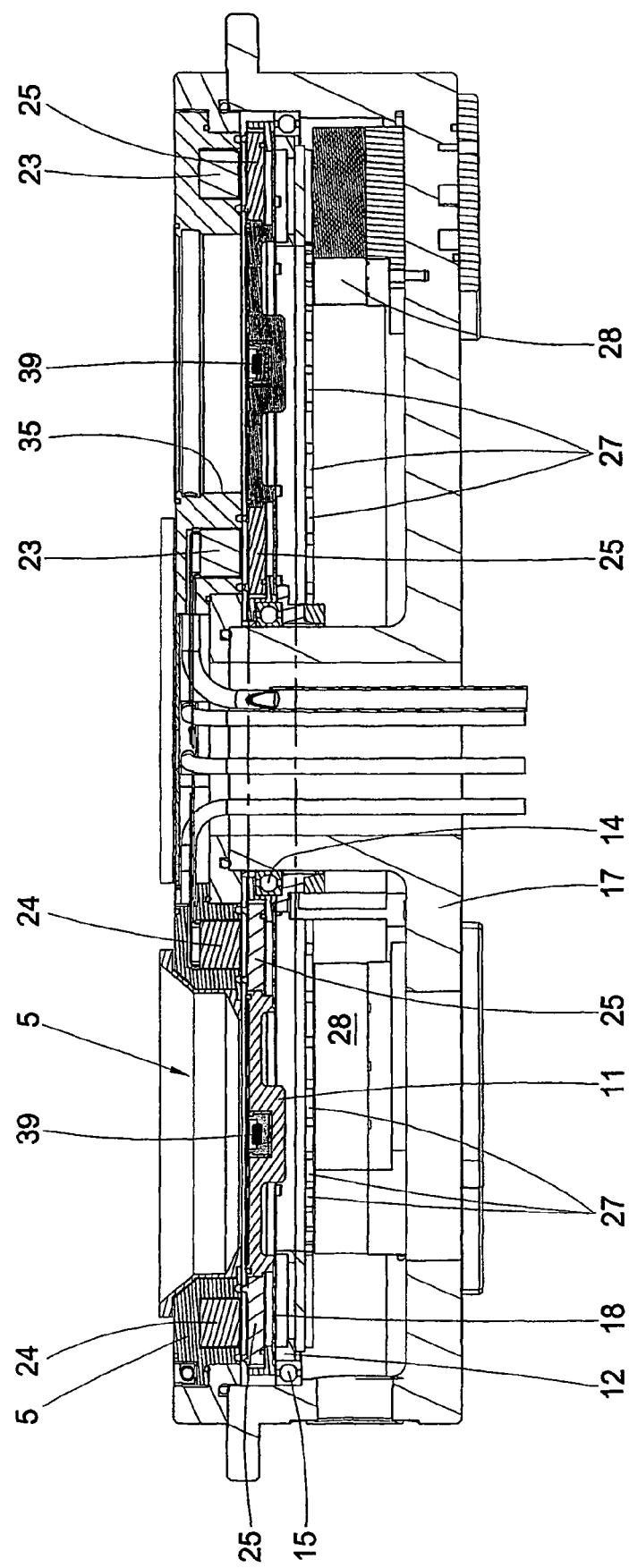
FIG. 5 shows a section along line V—V from FIG. 4.
Figure 6:
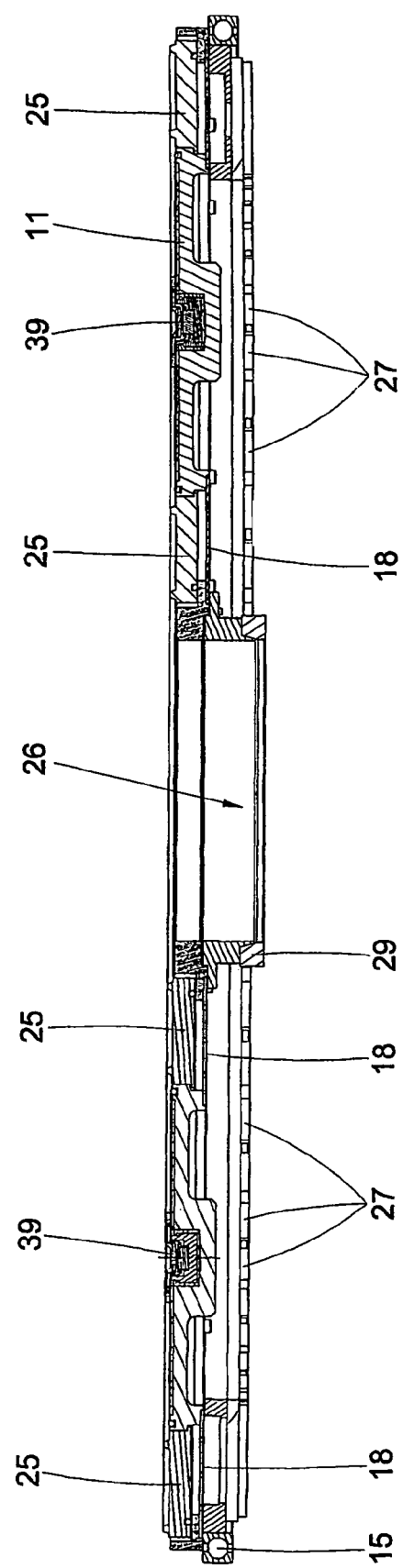
FIG. 6 shows a section along line VI—VI from FIG. 7 of the table present in the vacuum lock.
Figure 7:
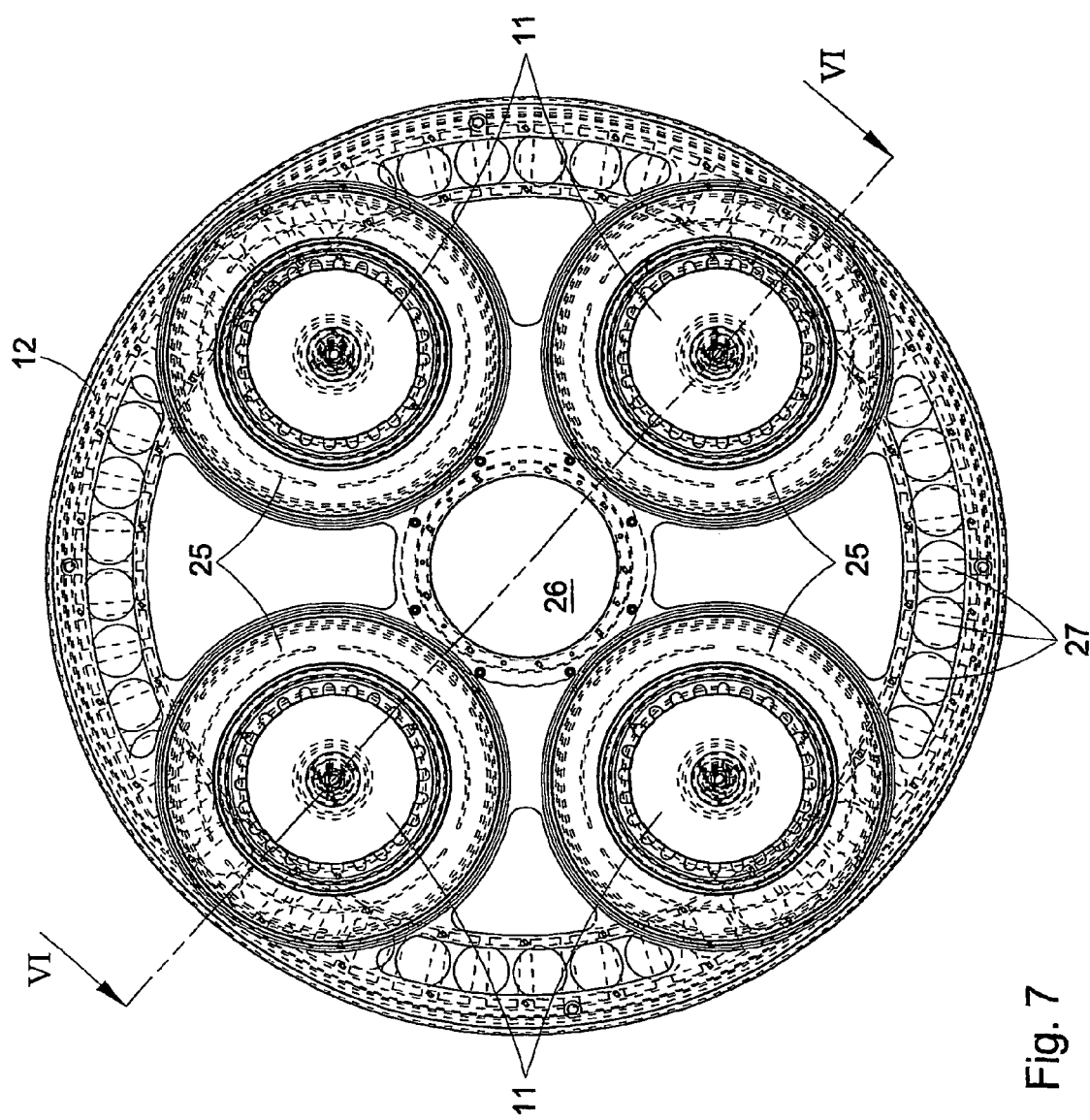
FIG. 7 shows a top plan view of the table shown in FIG. 6.
Figure 8:
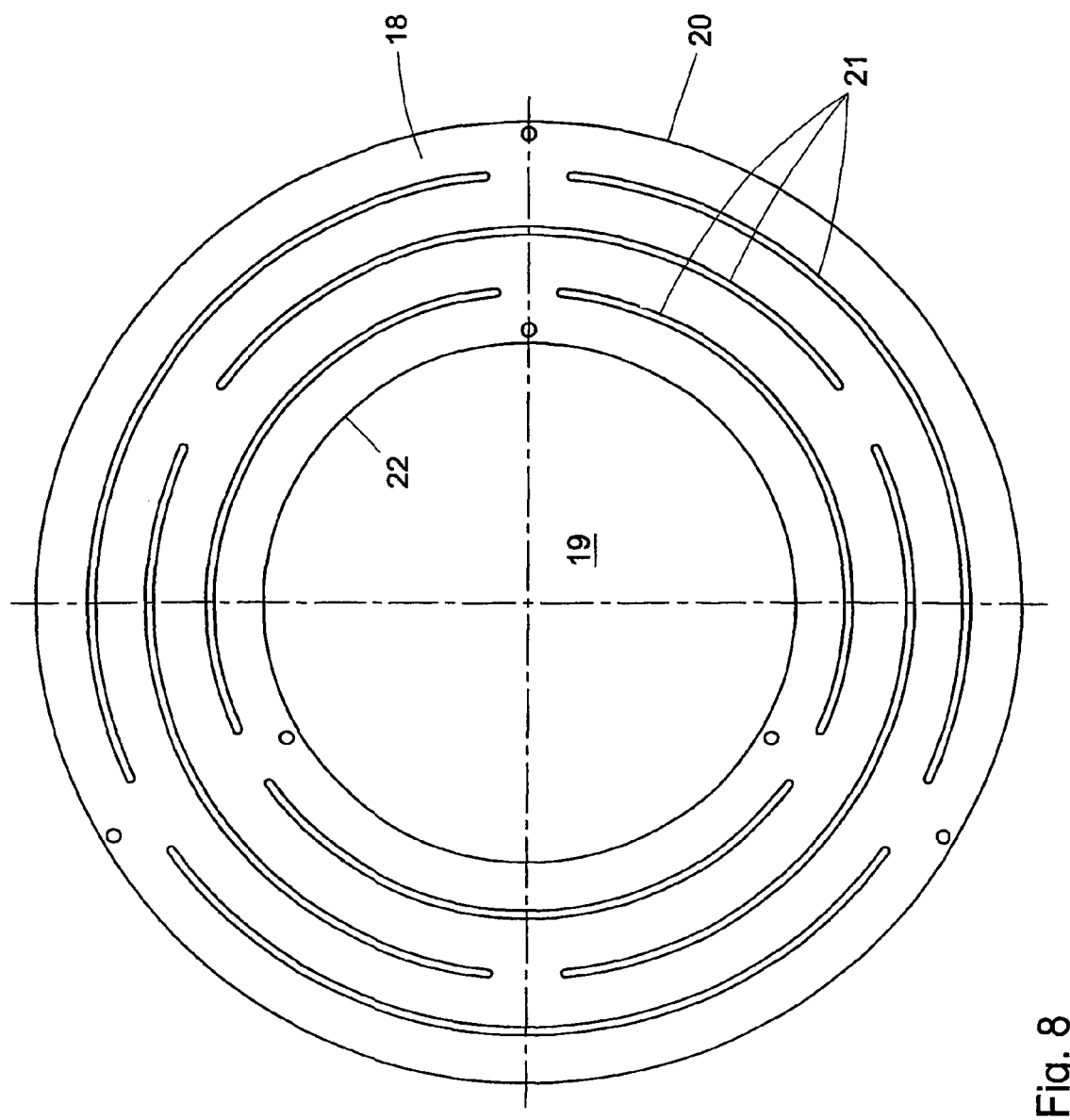
FIG. 8 shows a top plan view of the connecting spring by means of which the inner cover is connected with the table.

FIG. 5 shows more clearly the manner in which the table 12 is included in the vacuum lock 1 and in what way the inner covers 11 are connected with the table 12. In FIG. 6, too, this connection is clearly represented. The inner cover 11 is connected with the table 12 so as to be displaceable relative to this table 12 in a direction perpendicular to the plane of the table 12. In the present exemplary embodiment, this connection is formed by a spring connection 18, which is represented in top plan view in FIG. 8. In the present exemplary embodiment, the spring connection 18 is designed as a disc-shaped plate 18 with a central opening 19 in which the inner cover 11 is fitted. The disc-shaped plate 18 is attached, through an outer circumferential edge 20 thereof, to the table 12. In the disc-shaped plate 18, circular segment-shaped recesses 21 are provided, which enable a displacement of the central opening 19 relative to the outer circumferential edge 20 in a direction perpendicular to the plane of the plate 18, while the edge 22 of the central opening 19 and the outer circumferential edge 20 remain accurately parallel. Further, FIG. 5 clearly shows that electromagnetic coils 23, 24 are arranged in the top wall 5 around the supply opening 7 and the process chamber opening 8. Further, it is clearly visible that on the inner covers 11 a closing ring 25 extending along the circumference of the inner cover 11 is mounted. This closing ring 25 is manufactured from magnetically susceptible material. The electromagnetic coils 23, 24 are connected to a controllable power source which for the purpose of closing the inner cover 11 can generate an electromagnetic field in the coil 23, 24 which exerts an attractive action on the closing ring 25. Upon excitation of the electromagnetic coils 23, 24, the closing ring 25 is pulled up against the upper wall 5 of the vacuum lock 1. When the excitation of the electromagnetic coils 23, 24 is ended, the inner cover 11 will open automatically as a result of the outside air pressure exerted thereon. In FIG. 7, the disc-shaped table 12 is represented in top plan view. Clearly visible is that the table is provided with a central opening 26 in which the inner bearing 14 is located. Further, in a top plan view it is clearly visible that the table 12 is provided with four inner covers 11. Also shown clearly are the closing rings 25 and a series of permanent magnets 27. The permanent magnets 27 are mounted alternately with the magnetic field direction in opposite directions. FIG. 5 shows two of three electromagnetic coils 28 present in the vacuum lock 1, which coils 28 are connected with the bottom wall 17 of the vacuum lock. The coils 28 are connected to a controllable power source for forming an alternating magnetic field for the purpose of displacing, more particularly rotating, the table 12. As the drive of the table 12, which drive is formed by the series of permanent magnets 27 and the coils 28, is included in the vacuum chamber 13 of the vacuum lock 1, no lead-through provisions for moving parts need to be incorporated in the walls of the vacuum lock. This is of great advantage from the viewpoint of maintenance and vacuum technique. In the exemplary embodiment represented, the table 12 can be rotated through 180 degrees in 0.3 seconds. FIGS. 3, 5 and 6 further show clearly an encoder ring 29. This encoder ring cooperates with an encoder sensor (not shown) which is disposed in the central support 16 of the vacuum lock 1. By means of the encoder ring 29 and the encoder sensor, the position of the table 12 in the vacuum chamber 13 is known in each case.

Figure 10:
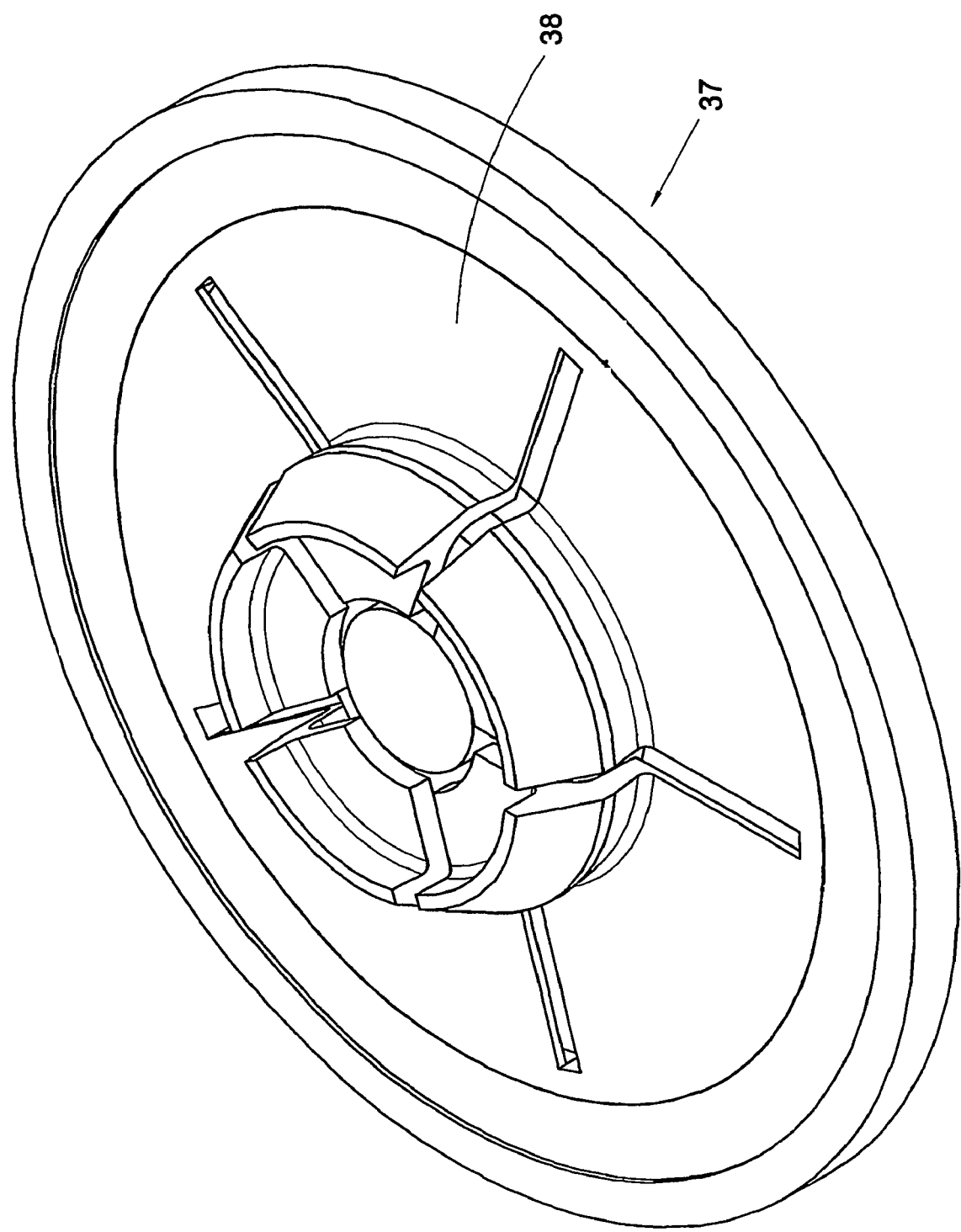
FIG. 10 shows a perspective view of a clamping piece.

FIG. 9 shows a mounting plate 30 which is provided with an opening 31 in which the vacuum lock 1 can be mounted. Connected with the mounting plate 30 is a transport device 32. In the present exemplary embodiment, this transport device 32 is designed as a star of arms 34 rotatable around a central axis 33. Suspended from the ends of these arms 34 are the outer covers 10, serving to close the supply openings 7 of the vacuum lock 1. When the outer covers 10 are placed in a supply opening 7 of the vacuum lock 1, and when moreover the inner cover 11 of the respective supply opening 7 is in a closed position, the space bounded by the opening edge 35 of the supply opening 7 and the inner cover 11 and the outer cover 10 has such dimensions that the substrate to be processed can be just received therein, so that the volume of the space which after closure of the outer cover is to be readjusted to the desired reduced pressure, is minimal. The outer cover 10, which is represented in more detail in FIGS. 11 and 12, is provided with a carrying head 36 for engaging the substrate. In the present exemplary embodiment, the substrates are provided with a central opening and these substrates are more particularly intended for manufacturing a CD or DVD. The transport device 32 comprises loose clamping pieces 37 which are detachably connected with the carrying head 36 and which are clampable in the central opening of a substrate to be treated. In the present exemplary embodiment, the clamping piece 37, which is represented in more detail in FIG. 10, is manufactured from magnetically susceptible material. The carrying heads 36 are each provided with an electromagnetic coil 38 which is connected to a controllable power source which for the purpose of retaining the clamping piece, and hence the substrate, generates an electromagnetic field in the coil which exerts an attractive action on the clamping piece 37. The clamping piece 37 is further provided with a disc-shaped part 38 which serves as an inner mask for screening the central part of the substrate during the processing thereof in the process chamber 2, 3. The inner covers 11 are provided with permanent magnets 39 for clamping the clamping piece 37 for the purpose of centered retention of a substrate on the inner cover 11.

The operation of the apparatus is as follows:

With the aid of the transport device 32, a substrate in which a clamping piece 37 has been fitted is picked up and transported to the supply opening 7 of the vacuum lock 1. Next, the outer cover 10 is lowered into the supply opening by means of the transport device 32. The substrate is situated in the close-fitting space which is bounded by the outer cover 10, the inner cover 11 and the circumferential edge 35 of the supply opening 7. In this phase, the electromagnetic coils 23 are excited, so that the closing ring 25 of the respective inner cover 11 abuts against the coils 23 and the inner cover 11 is in a closed condition. Thereafter, the excitation of the coils 23 is terminated, so that the inner cover 11 opens under the influence of the pressure prevailing in the space mentioned. The inner cover is now in the plane under the top wall 5 of the vacuum lock 1. Then the electromagnetic coils 28 of the drive of the table 12 can be excited to rotate the table 12 and to bring the respective inner cover 11 under the process chamber opening 8. The position of the table 12 is being accurately measured by the encoder ring 29 with the associated encoder sensor. When the respective inner cover 11 is situated under the process chamber opening 8, the closing coils 24 situated there are excited and the inner cover 11 is pulled against the top wall 5 of the vacuum lock. Next, the substrate disposed on the inner cover 11 can undergo a treatment in the process chamber 2, 3. Upon completion of the processing operation, the excitation of the closing coils 24 can be ended and the table 12 can be rotated, so that the respective inner cover can be brought to another process chamber opening to undergo another treatment there or to bring the respective inner cover 11 to a supply opening 7 to remove the substrate from the vacuum lock 1. For the purpose of removing the substrate, the closing coils 23 extending around the respective supply opening 7 are again excited, whereafter the space located between the outer cover 10 and the inner cover 11 is aerated, so that the ambient pressure prevails therein. When such is the case, the outer cover 10 can be lifted with the aid of the transport device 32, thereby taking the substrate along. The substrate can subsequently be delivered at another position by the transport device 32 by terminating the excitation of the electromagnetic coil 38 in the carrying head 36.

It will be clear that the invention is not limited to the exemplary embodiment described but that various modifications within the framework of the invention as defined by the claims are possible. Thus, in the process chamber, instead of a sputter process, a different processing operation can take place, such as, for instance, a different form of physical vapor deposition (PVD), chemical vapor deposition (CVD), plasma enhanced chemical vapor deposition (PECVD), annealing or the like. Optionally, a process chamber may have a separate process chamber pump connected to it for exhausting from the process chamber gases supplied or formed during the processing operation. Optionally, it is also possible that between a process chamber and the vacuum chamber 13 a bypass line with a restriction which may or may not be controllable is incorporated to maintain a pressure difference between the process chamber and the vacuum chamber 13 during the treatment process. Under those conditions, a separate process chamber pump can optionally be omitted. It will further be clear that with the apparatus described above and the assembly described above, in succession different processes can be performed. To that end, it is evidently necessary that different process chambers be connected with the vacuum lock.

The invention claimed is:

1. An apparatus for performing at least one processing operation on a substrate, comprising:
   a process chamber in which, in use, a processing operation takes place under reduced pressure, and
   a vacuum lock for placing the substrate from the surroundings into said process chamber without the reduced pressure in the respective process chamber being lost, the vacuum lock comprising
      a vacuum chamber bounded by a number of walls,
      a vacuum pump connected to the vacuum chamber,
      a supply opening provided in one of the walls,
      a process chamber opening in the process chamber, wherein the supply opening is externally closable with an outer cover and is closable from the vacuum chamber with an inner cover, the inner cover being configured to support a substrate and being displaceable within the vacuum chamber to said process chamber opening, a table in the vacuum chamber and in which the inner cover is placed, wherein the table is displaceable by a drive, wherein the drive is included in the vacuum chamber of the vacuum lock, wherein the drive comprises a plurality of magnets mounted on the table and at least one electromagnetic coil mounted on the walls of the vacuum lock, the coil being connected to a controllable power source for forming an alternating magnetic field for displacing the table.

2. An apparatus according to claim 1, wherein the number of walls comprises:

a substantially cylindrical circumferential wall, and two substantially flat end walls, wherein in one of the end walls the supply opening and the process chamber opening are provided, the two end walls being connected to each other by a central support adjacent to or in the middle of the cylindrical circumferential wall.

3. An apparatus according to claim 2, wherein the table comprises a substantially circular disc which is rotatably bearing-mounted on the central support and on the cylindrical circumferential wall.

4. An apparatus according to claim 3, wherein on or adjacent to the cylindrical circumferential wall, at uniformly distributed circumferential positions, at least one electromagnetic coil is mounted, and adjacent a circular circumferential edge of the table the said plurality of magnets are arranged.

5. An apparatus according to claim 4, wherein an encoder ring is arranged on the table for determining the relative position of the table with respect to the walls of the vacuum chamber.

6. An apparatus according to claim 1, wherein the inner cover is placed in the table so as to be displaceable in a direction perpendicular to the table.

7. An apparatus according to claim 6, wherein the the table and the inner cover are connected by a spring.

8. An apparatus according to claim 7, wherein the spring comprises a disc-shaped plate having a central opening in which the inner cover is fitted, the disc-shaped plate is attached to the table by an outer circumferential edge of the disc-shaped plate, and concentric, circular segment-shaped recesses are provided in the disc-shaped plate to enable a displacement of the central opening relative to the outer circumferential edge in a direction perpendicular to the plane of the disc-shaped plate while the edge of the central opening and the outer circumferential edge remain parallel.

9. An apparatus according to claim 8, wherein the inner cover comprises a closing ring of magnetically susceptible material, extending along the circumference of the inner cover, and around and adjacent the edges of the supply opening and the process chamber opening at least one second electromagnetic coil is arranged and connected to the controllable power source for closing the inner cover by generating an electromagnetic field in the coil which exerts an attractive action on the closing ring.

10. An apparatus according to claim 1, wherein a said process chamber comprises a process chamber pump connected thereto.

11. An apparatus according to claim 1, wherein a said process chamber comprises a plasma source for plasma enhanced chemical vapor deposition.

12. An apparatus according to claim 1, wherein a said process chamber comprises a physical vapor deposition source.

13. An apparatus according to claim 1, wherein a said process chamber comprises means for performing chemical vapor deposition.

14. An apparatus according to claim 1, wherein said process chamber comprises means for annealing the substrate.

15. An apparatus according to claim 1, wherein a space is bounded by an opening edge of the supply opening and the inner cover and the outer cover, when the inner cover and the outer cover are in a closed condition, the space being adjusted to the reduced pressure after closure of the outer cover.

16. An apparatus according to claim 1, wherein a said process chamber opening is substantially closable from the vacuum chamber with said inner cover.

17. An assembly comprising an apparatus according to claim 1 and a transport device for supplying and removing substrates to and from the supply opening of the vacuum lock, the transport device comprising a carrying head for engaging the substrates, the carrying head being displaceable by a transport mechanism.

18. An assembly according to claim 17, wherein each substrate comprises a central opening the transport device comprising a clamping piece clampable in the central opening engageable by the carrying head.

19. An assembly according to claim 18, wherein the clamping piece comprises magnetically susceptible material, and the carrying head comprises at least one third electromagnetic coil, the at least one third electromagnetic coil being connected to the controllable power source for retaining the clamping piece by generating an electromagnetic field in the at least one third electromagnetic coil, which exerts an attractive action on the clamping piece.

20. An assembly according to claim 19, wherein the clamping piece comprises a disc-shaped part which screens the central opening of the substrate during the processing in the process chamber.

21. An assembly according to claim 20, wherein the inner cover comprises a permanent magnet which exerts an attractive action on the clamping piece.

22. An assembly according to claim 17, wherein the carrying head carries said outer cover.

* * * * *